US005278520A

United States Patent [19]
Parker et al.

[11] Patent Number: 5,278,520
[45] Date of Patent: Jan. 11, 1994

[54] PHASE LOCK DETECTION IN A PHASE LOCK LOOP

[75] Inventors: Lanny L. Parker, Mesa; Ahmad H. Atriss, Chandler, both of Ariz.

[73] Assignee: Codex, Corp., Mansfield, Mass.

[21] Appl. No.: 966,824

[22] Filed: Oct. 26, 1992

[51] Int. Cl.[5] .................. H03L 7/095; H03L 7/18
[52] U.S. Cl. ................... 331/1 A; 331/25; 331/DIG. 2
[58] Field of Search .................................... 331/1

[56] References Cited
U.S. PATENT DOCUMENTS 4,675,558  6/1987  Serrone et al. ........... 331/DIG. 2 X
5,126,690  6/1992  Bui et al. .................. 331/1 A
5,161,175  11/1992  Parker et al. ............. 328/120 X Primary Examiner—Siegfried H. Grimm
Attorney, Agent, or Firm—Robert D. Atkins

[57] ABSTRACT

A phase lock loop monitors a first digital signal and generates a second digital signal operating substantially at frequency and in-phase with the first digital signal. The first and second digital signals are applied to a lock detection circuit for providing a lock detection signal when the first and second digital input signals have a first logic state at a first transition of a control signal and a second logic state at a second transition of the control signal. One false lock triggers an out-of-phase status indicator. The lock detection signal must return to a valid state for a predetermined number of periods before the phase lock status indicates a valid lock condition. The first and second digital input signals may operate with a non-50% duty cycle.

15 Claims, 5 Drawing Sheets

1

PHASE LOCK DETECTION IN A PHASE LOCK LOOP

BACKGROUND OF THE INVENTION

The present invention relates in general to phase lock loops and, more particularly, to a phase lock loop with a phase lock detection feature.

Phase lock loops (PLLs) are found in a myriad of electronic applications such as modems and clock synchronization circuits for computer systems. A conventional PLL generally includes a phase detector for monitoring a phase difference between an input signal and an output signal of a voltage controlled oscillator (VCO). The phase detector generates an up control signal and a down control signal for a charge pump to charge and discharge a loop filter at a loop node at the input of the VCO. The loop voltage developed across the loop filter determines the output frequency of the VCO. The up and down control signals driving the charge pump set the proper loop node voltage at the input of the VCO to maintain a predetermined phase relationship between the signals applied to the phase detector.

It is common for the PLL to lose phase lock should the input signal fade or jump to a different frequency of operation. The out-of-lock state can be detected with a lock detection circuit and other system processing suspended until the PLL can re-establish phase lock. One lock detection scheme monitors the up control signal and the down control signal at the output of the phase detector to ascertain the lock status of the PLL. If the up control signal and down control signal are not pulsing, the loop node voltage remains substantially constant and the PLL should be in phase lock. When the up control signal and the down control signal are steadily generating pulses charging or discharging the loop filter to adjust the input voltage of the VCO, the loop must be in motion and thus out of phase lock.

During normal operation, the loop node is continuously subjected to leakage through the charge pump circuit thus requiring occasional pulses to maintain the voltage controlling the VCO. However, these intermittent pulses should not indicate an out-of-lock condition. The conventional lock detection circuit may include a delay circuit comprising a string of serially coupled inverters designed to ignore short intermittent pulses from the phase detector having less than a predetermined pulse width. The up and down control signals must have a pulse width at least as long as the delay circuit to trigger an out-of-lock condition. Unfortunately, the pulse widths of the up and down control signals are subject to temperature and process variation and therefore are not well suited as control parameters for ascertaining phase lock. The pulse widths of the up and down control signals are merely rough indicators having limited accuracy of the true phase relationship between the input signals of the phase detector.

Another known lock detection scheme looks at the phase difference between input signal and the output signal of the VCO as applied to the phase detector. If the transition of these signals occur outside a timeslot window, the loop is out of phase lock. The timeslot window is typically generated from the VCO frequency and requires the input signal to have a 50% duty cycle since the lock detector checks both edges of the input signal. It is desirable to eliminate the requirement for an input signal with a 50% duty cycle.

Hence, a need exists for an improved lock detection circuit for a PLL which directly monitors the input signals of the phase detector to determine the lock status of the loop, wherein the input signals may operate with a non-50% duty cycle.

SUMMARY OF THE INVENTION

Briefly stated, the invention comprises a lock detection circuit including a NAND gate having a first input receiving a first digital input signal and a second input receiving a second digital input signal. A first transistor includes a drain coupled to the output of the NAND gate and a gate receiving a control signal. A first latching circuit has an input coupled to the source of the first transistor. A NOR gate including a first input receiving the first digital input signal, a second input receiving the second digital input signal, a third input coupled to the output of the first latching circuit, and an output providing a lock detection signal.

In another aspect, the present invention is a method of detecting phase lock for a phase lock loop responsive to a first digital signal for generating a second digital signal operating substantially at frequency and in-phase with the first digital signal comprising the steps of comparing a phase difference between first and second digital input signals and generating an output signal to charge and discharge a loop node, generating an oscillator signal operating at a frequency as determined by the output signal, dividing down a frequency of the oscillator signal for providing the second digital input signal and a control signal having first and second transitions, and sampling the first and second digital input signals at the first and second transitions of the control signal and providing a lock detection signal when the first and second digital input signals have a first logic state at the first transition of the control signal and a second logic state at the second transition of the control signal.

DETAILED DESCRIPTION OF THE PREFERRED EMBODIMENT

Figure 1:
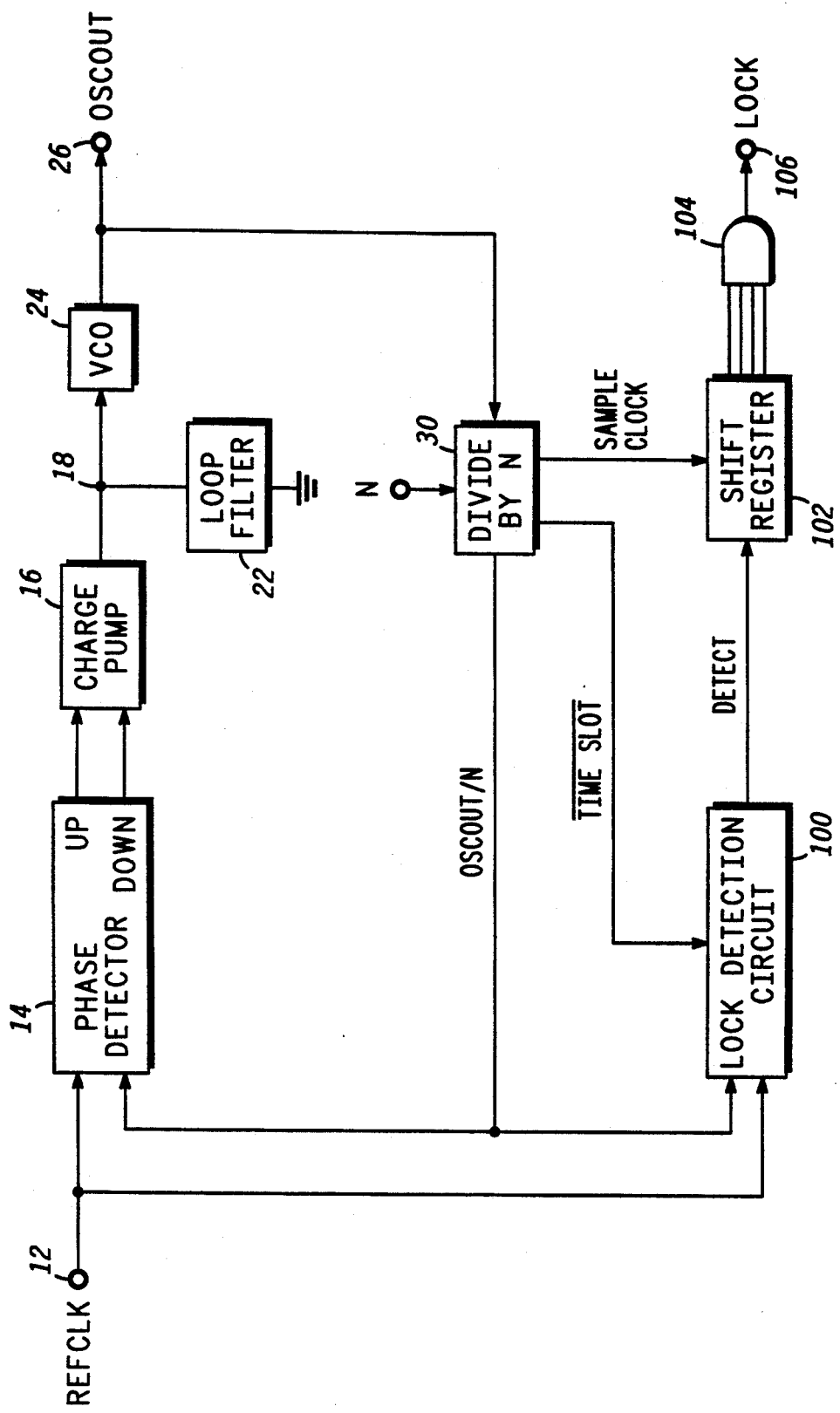
FIG. 1 is a block diagram illustrating a phase lock loop with lock detection.

A phase lock loop (PLL) 10 in accordance with the present invention is shown in FIG. 1 suitable for manufacturing as an integrated circuit using conventional integrated circuit processes. A REFCLK signal is applied at input 12 at a first input of phase detector 14 to generate an UP control signal and a DOWN control signal for charge pump 16. Charge pump 16 may comprise a P-channel transistor and an N-channel transistor (not shown) serially coupled between a positive power supply conductor and ground potential, wherein the P-channel transistor is responsive to the UP control signal and the N-channel transistor is responsive to the DOWN control signal. The interconnection at the drains of the charge pump transistors drives loop node 18 for charging and discharging loop filter 22 which may comprise a capacitor (not shown) coupled between loop node 18 and ground potential. The voltage at loop node 18 controls VCO 24 for generating an oscillator signal OSCOUT at output 26. The OSCOUT signal of VCO 24 is divided through divide-by-N circuit 30 for providing an OSCOUT/N signal applied at a second input of phase detector 14.

The operation of PLL 10 proceeds as follows. The REFCLK signal applied at the first input of phase detector 14 in combination with the OSCOUT/N signal applied at the second input of the same generates an UP control signal, or the DOWN control signal, according to the phase relationship therebetween. The UP control signal pulses if the OSCOUT/N signal lags the REFCLK signal, i.e., the frequency of the OSCOUT/N signal is too low relative to the REFCLK signal. Alternately, the DOWN control signal pulses to reduce the frequency of the oscillator signal from VCO 24 if the OSCOUT/N signal leads the REFCLK signal. Charge pump 16 is responsive to the UP control signal and the DOWN control signal for charging and discharging loop node 18. The voltage developed at loop node 18 drives VCO 24 to generate up to say 200 MHz for the OSCOUT signal which is divided down by divide-by-N circuit 30 for providing the OSCOUT/N signal at the second input of phase detector 14. A control signal N selects the divisor of divide-by-N circuit 30, e.g. N=16. Thus, phase detector 14 monitors the phase difference between the REFCLK signal and the OSCOUT/N signal and generates UP and DOWN control signals as necessary for charge pump 16 to drive loop node 18 and VCO 24 to maintain a predetermined phase relationship between the REFCLK and OSCOUT/N signals.

Figure 2:
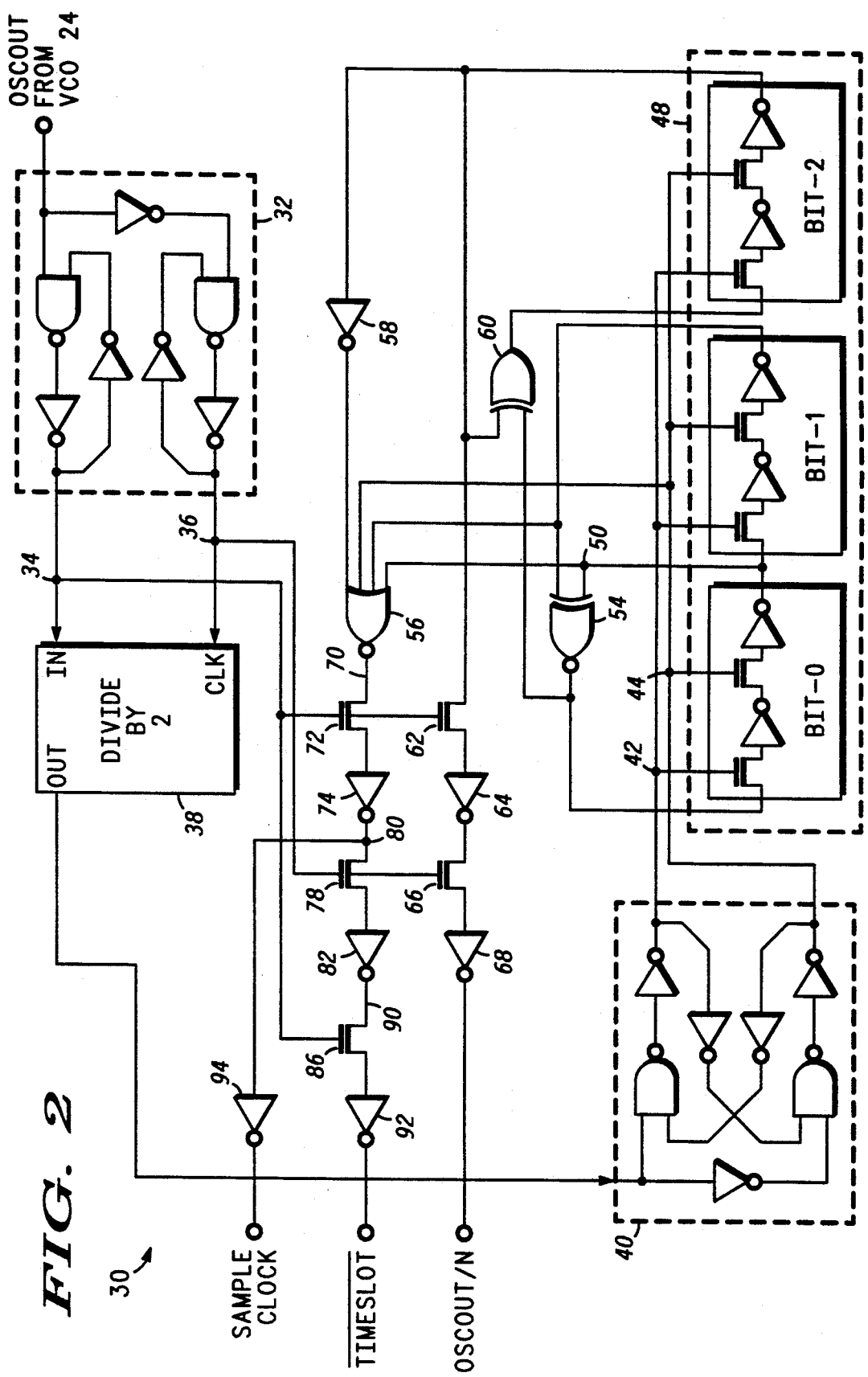
FIG. 2 is a schematic diagram illustrating a divide-by-N circuit for generating TIMESLOT and SAMPLE__CLOCK.
Figure 3:
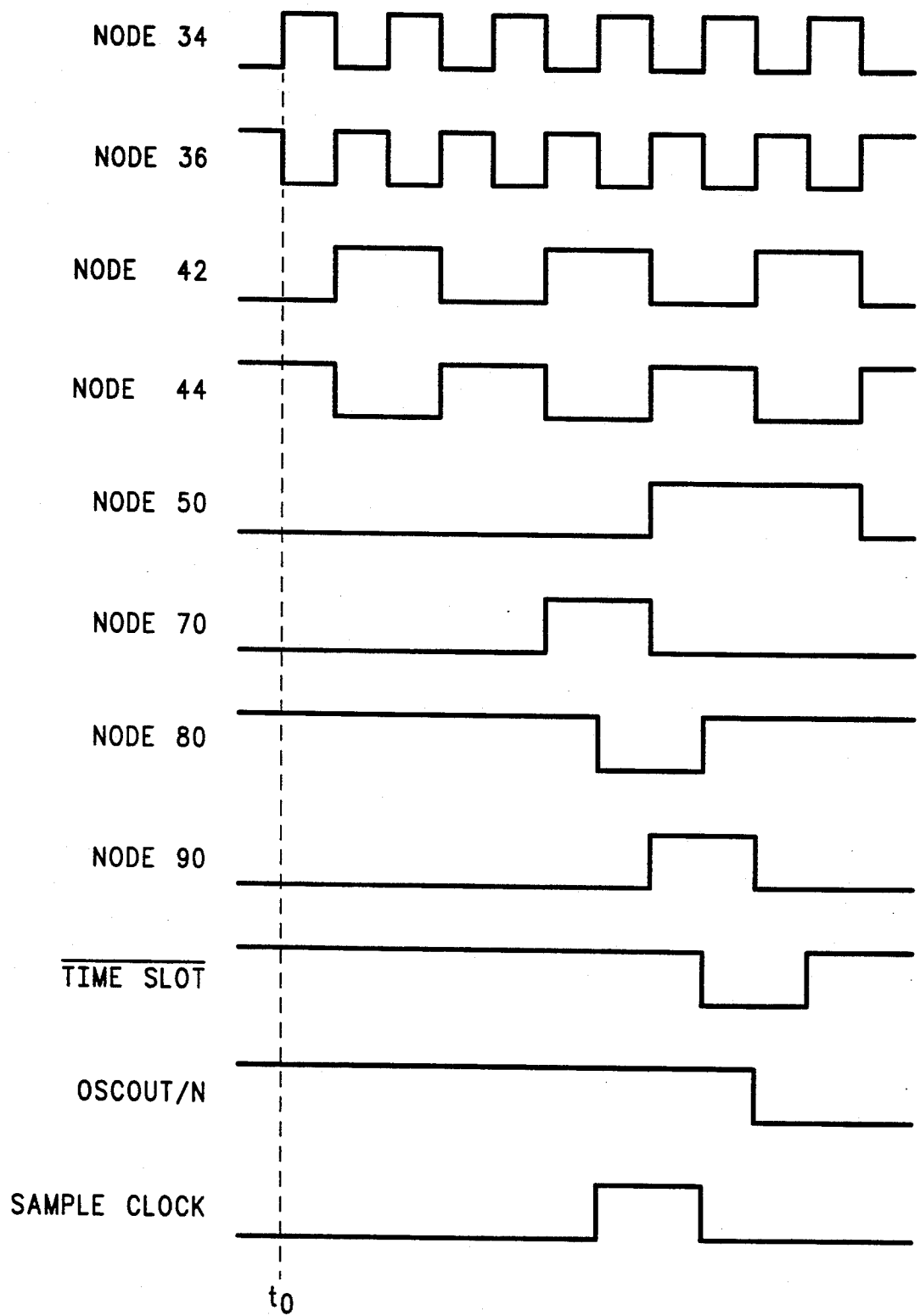
FIG. 3 is waveform plot illustrating operation of the divide-by-N circuit.

Further detail of divide-by-N circuit 30 is shown in FIG. 2 including circuit 32 for generating complementary, non-overlapping clock signals at nodes 34 and 36 from the OSCOUT signal of VCO 24 as illustrated in FIG. 3. The in-phase clock signal from node 34 is divided down through divide-by-2 circuit 38 and again split by circuit 40 into complementary, non-overlapping clock signals at nodes 42 and 44 as shown in FIG. 3. The non-overlapping clock signals are never logic one at the same time. The operation of circuits 32 and 40 is disclosed in U.S. Pat. No. 5,144,170, "Circuit and Method of Aligning Clock Signals", and is hereby incorporated by reference. The clock signals at nodes 42 and 44 control 3-bit shift register 48, wherein the bit 0, bit 1 and bit 2 sections of shift register 48 each include first and second inverters and first and second transistors responsive to the non-overlapping clock signals as shown in FIG. 2. The output of the bit 0 section at node 50 is applied at the first inputs of exclusive-NOR gate 54 and NOR gate 56, while the second inputs of the same are coupled to the output of the bit 1 section. NOR gate 56 also includes a third input coupled to node 44. The output of the bit 2 section of shift register 48 is coupled through inverter 58 to a fourth input of NOR gate 56. The output of exclusive-NOR gate 54 is coupled to the input of the bit 0 section and to the first input of exclusive-OR gate 60. The output of exclusive-OR gate 60 is coupled to the input of the bit 2 section of shift register 48, the output of which is coupled to the second input of exclusive-OR gate 60 and to the drain of transistor 62. The source of transistor 62 is coupled through inverter 64 to the drain of transistor 66, and the source of transistor 66 is coupled through inverter for providing the OSCOUT/N signal as shown in FIG. 3. Node 70 at the output of NOR gate 56 is coupled to the drain of transistor 72 which includes a source coupled through inverter 74 to the drain of transistor 78 at node 80. The source of transistor 78 is coupled through inverter 82 to the drain of transistor 86 at node 90, and the source of transistor 86 is coupled through inverter 92 for providing a $\overline{\text{TIMESLOT}}$ signal as shown in FIG. 3. The gates of transistors 66 and 78 are coupled to node 36 for receiving the complemented clock signal from circuit 32, while the gates of transistors 62, 72 and 86 are coupled to node 34 for receiving the in-phase clock signal. The signal at node 80 is inverted by inverter 94 for providing a SAMPLE_CLOCK signal shown in FIG. 3.

Exclusive-NOR gate 54 and exclusive-OR gate 60 provide the inputs to 3-bit shift register 48 for a divide-by-six operation including the following states:

| State | Bit 2 | Bit 1 | Bit 0 |
|---|---|---|---|
| 1 | 0 | 0 | 0 |
| 2 | 1 | 0 | 1 |
| 3 | 1 | 1 | 0 |
| 4 | 1 | 0 | 0 |
| 5 | 0 | 0 | 1 |
| 6 | 0 | 1 | 0 |

The $\overline{\text{TIMESLOT}}$ signal operates at the same frequency as the OSCOUT/N signal with its low state centered about the zero-going (logic one-to-logic zero) transitions of the OSCOUT/N signal. When the output of the bit 2 section of shift register 48 is logic zero (OSCOUT/N logic zero), inverter 58 produces a logic one and keeps node 70 at logic zero. Thus, NOR gate 56 cannot produce a logic zero $\overline{\text{TIMESLOT}}$ pulse during the low state of the OSCOUT/N signal. By generating the $\overline{\text{TIMESLOT}}$ signal only at the zero-going transitions of the OSCOUT/N signal, the REFCLK signal need no longer have a 50% duty cycle because phase lock is checked only at one edge (zero-going) each cycle of the REFCLK signal. The low state of the $\overline{\text{TIMESLOT}}$ signal defines a $\overline{\text{TIMESLOT}}$ window having a duration of say 20 nanoseconds compared to the overall period of the REFCLK signal of 250 nanoseconds. The SAMPLE_CLOCK signal operates at the same frequency as the TIMESLOT signal with a positive pulse just prior to the falling edge of the $\overline{\text{TIMESLOT}}$ signal, see FIG. 5.

Returning to FIG. 1, as part of the present invention, the REFCLK signal and the OSCOUT/N signal are applied at the first and second inputs of lock detection circuit 100. The $\overline{\text{TIMESLOT}}$ signal from divide-by-N circuit 30 is also applied to lock detector circuit 100 for generating a DETECT signal when the REFCLK signal and OSCOUT/N signal are logic one at the time of the zero-going transition of the $\overline{\text{TIMESLOT}}$ signal and logic zero at the time of the positive-going transition of the $\overline{\text{TIMESLOT}}$ window. The $\overline{\text{TIMESLOT}}$ window is defined as the low state of the $\overline{\text{TIMESLOT}}$ signal.

The DETECT signal from lock detection circuit 100 is applied at the data input of 4-bit shift register 102 while the SAMPLE_CLOCK signal from divide-by-N circuit 30 is applied at the clock input of the same. Shift register 102 includes a tap point at each bit position coupled to the inputs of AND gate 104 for providing a LOCK signal at output 106. It takes only one false DETECT signal (logic zero) shifting into shift register 102 to drive the LOCK signal low indicating a out-of-lock condition. The DETECT signal must return to the true state (logic one) for at least four SAMPLE_CLOCK signal periods to completely shift the logic zero out of 4-bit shift register 102 and reestablish a true state for the LOCK signal. It is understood that shift register 102 can be made wider, say 12 bits or more, to increase the number of consecutive true DETECT signals necessary to issue a true LOCK signal.

Figure 4:
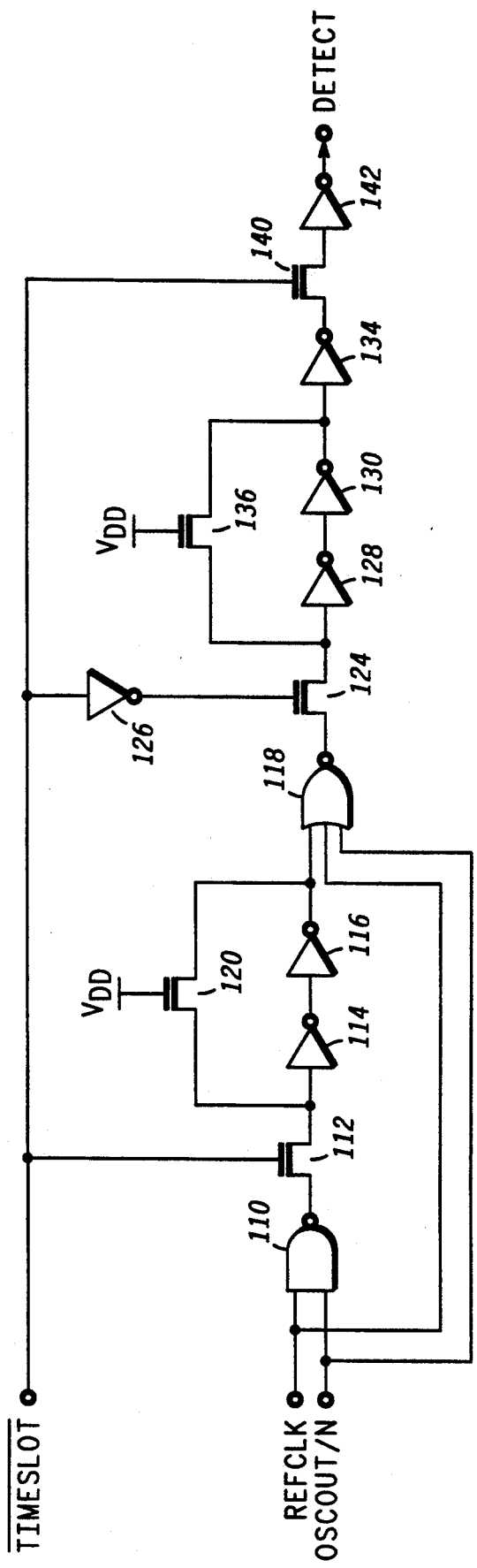
FIG. 4 is a schematic diagram illustrating a lock detection circuit.

Further detail of lock detector circuit 100 is shown in FIG. 4, wherein the REFCLK signal and the OSCOUT/N signal are applied at first and second inputs of NAND gate 110. The output of NAND gate 110 is coupled to the drain of transistor 112 which includes a gate coupled for receiving the $\overline{\text{TIMESLOT}}$ signal. The source of transistor 112 is coupled through inverters 114 and 116 to a first input of NOR gate 118. The REFCLK signal and the OSCOUT/N signal are applied at second and third inputs of NOR gate 118. Transistor 120 includes a drain coupled to the output of inverter 116, a source coupled to the input of inverter 114 and a gate coupled for receiving a positive power supply potential $V_{DD}$ (5.0 volts) for providing a latching feedback circuit around inverters 114-116. The output of NOR gate 118 is coupled to the drain of transistor 124, while the gate of transistor 124 receives the $\overline{\text{TIMESLOT}}$ signal complemented by inverter 126. The source of transistor 124 is coupled through inverters 128 and 130 to an input of inverter 134. Transistor 136 includes a drain coupled to the output of inverter 130, a source coupled to the input of inverter 128 and a gate coupled for receiving the positive power supply potential $V_{DD}$. The output of inverter 134 is coupled to the drain of transistor 140 which includes a gate coupled for receiving the $\overline{\text{TIMESLOT}}$ signal and a source coupled to the input of inverter 142. The output of inverter 142 provides the DETECT signal.

Figure 5:
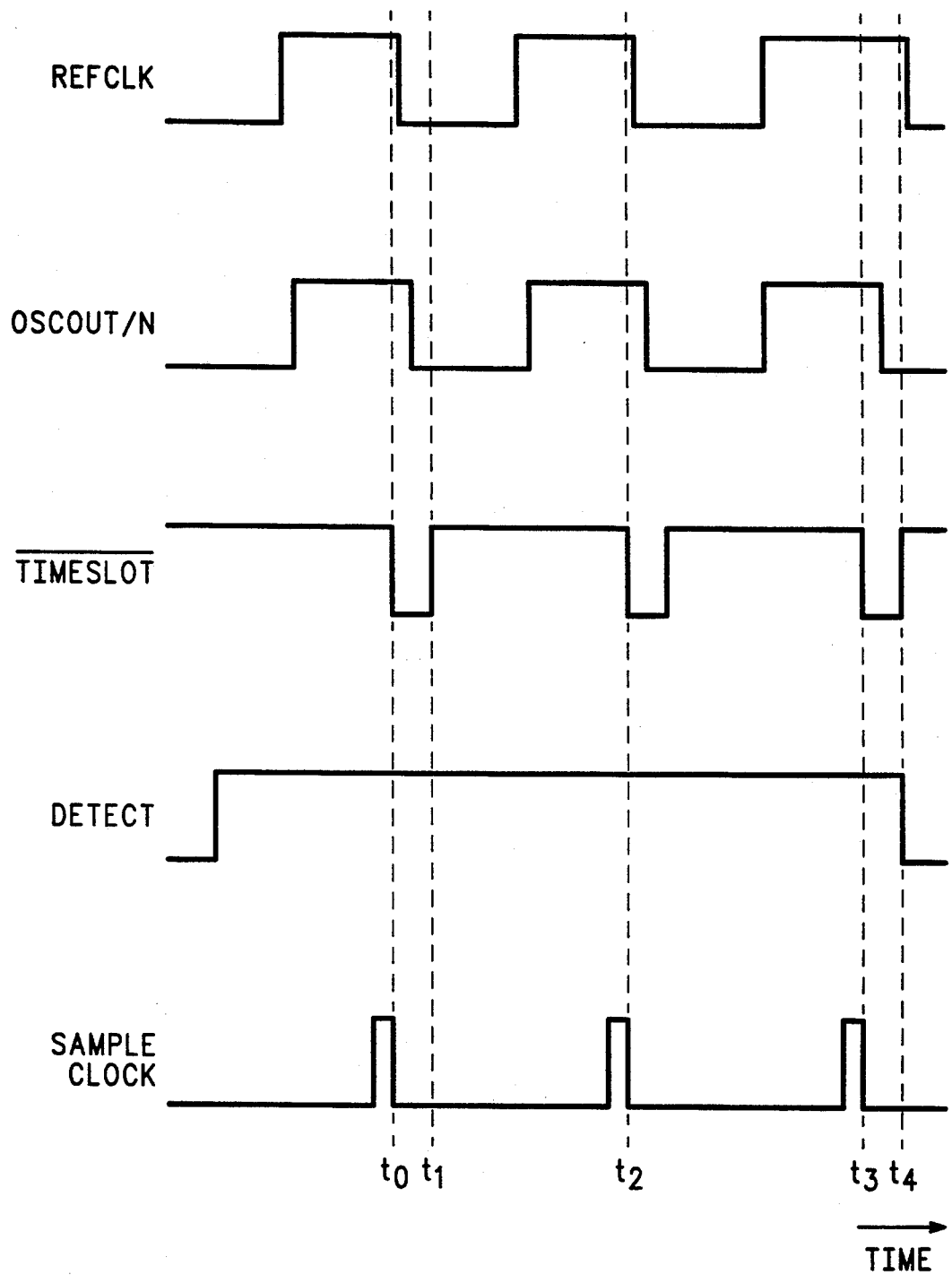
FIG. 5 is a waveform plot illustrating monitoring of phase lock.

The operation of lock detection circuit 100 may best be understood with the waveform plot of FIG. 5 which illustrate a phase lock condition and a detection of an out-of-lock condition. During normal operation just prior to time $t_0$ of FIG. 5, the OSCOUT/N signal and the REFCLK signal are both logic one producing a logic zero at the output of NAND gate 110 and a logic zero at the output of NOR gate 118. The $\overline{\text{TIMESLOT}}$ signal of FIG. 5 is high before time $t_0$ turning on transistor 112 and passing the logic zero to the first input of NOR gate 118. Transistor 120 latches the logic zero back to the input of inverter 114.

When the $\overline{\text{TIMESLOT}}$ signal goes to logic zero, transistor 112 turns off and transistor 124 turns on by inverter 126. The zero-going transition of the $\overline{\text{TIMESLOT}}$ signal samples the logic state of the REFCLK signal and the OSCOUT/N signal. If both are logic one, the output of NAND gate 110 is logic zero. Otherwise, the output of NAND gate 110 is logic one. The REFCLK signal and the OSCOUT/N signal both transition to logic zero between times $t_0$ and $t_1$ of FIG. 5 producing a logic one at the output of NOR gate 118 which passes through transistor 124 and inverters 128 and 130. Inverter 134 provides a logic zero at its output. Transistor 136 latches the logic one at the input of inverter 128. As the $\overline{\text{TIMESLOT}}$ signal returns to logic one after time t1, transistor 140 conducts the logic zero from inverter 134 to inverter 142 and provides a logic one DETECT signal. The positive-going transition of the $\overline{\text{TIMESLOT}}$ signal again samples the logic state of the REFCLK signal and the OSCOUT/N signal. If both are logic zero and the output of inverter 116 is logic zero, the output of NOR gate 118 is logic one. Otherwise, the output of NOR gate 118 is logic zero. As long as the REFCLK signal and OSCOUT/N signal are logic one at the time of the zero-going transition of the $\overline{\text{TIMESLOT}}$ signal and logic zero at the time of the positive-going transition of the $\overline{\text{TIMESLOT}}$ signal, the DETECT signal remains at logic one indicating a lock condition for PLL 10, see FIG. 5.

Now assume the REFCLK signal changes frequency after time $t_2$ such that PLL 10 is no longer in phase lock. Just prior to time $t_3$ of FIG. 5, the OSCOUT/N signal and the REFCLK signal are both logic one producing a logic zero at the output of NAND gate 110 and a logic zero at the output of NOR gate 118. The $\overline{\text{TIMESLOT}}$ signal of FIG. 5 is high before time $t_3$ turning on transistor 112 and passing the logic zero to the first input of NOR gate 118. Transistor 120 latches the logic zero at the input of inverter 114.

When the $\overline{\text{TIMESLOT}}$ signal goes to logic zero, transistor 112 turns off and transistor 124 turns on by inverter 126, thereby sampling the logic state of the REFCLK signal and the OSCOUT/N signal. The OSCOUT/N signal transitions to logic zero between times $t_3$ and $t_4$; however, REFCLK signal remains at logic one. The logic zero output of NOR gate 118 passes through transistor 124 and inverters 128 and 130. Transistor 136 latches the logic zero at the input of inverter 128. As the $\overline{\text{TIMESLOT}}$ signal returns to logic one after time $t_4$, transistor 140 conducts the logic one from inverter 134 to inverter 142 and provides a logic zero DETECT signal indicating a loss of phase lock for PLL 10. The positive-going sample detects the REFCLK signal out-of-phase with the OSCOUT/N signal. The logic zero DETECT signal shifts into shift register 102 of FIG. 1 at the next SAMPLE_CLOCK signal, see FIG. 5, which drives the LOCK signal at output terminal 106 to a logic zero false state. Thus, the lock detection feature of PLL 10 detects a change of frequency of the REFCLK signal and produces a false LOCK signal.

A similar "no phase lock" result follows if the REFCLK signal switches to logic zero before the zero-going $\overline{\text{TIMESLOT}}$ sampling. The output of NAND gate 110 at logic one latches at the output of inverter 116 as the $\overline{\text{TIMESLOT}}$ signal switches to logic zero. NOR gate 118 continues to provide a logic zero throughout the $\overline{\text{TIMESLOT}}$ signal and the DETECT signal goes to logic zero thereby indicating an out of lock condition.

In summary, the REFCLK and OSCOUT/N signals must both be logic one so that the output of NAND gate 118 is logic zero before the zero-going transition of the $\overline{\text{TIMESLOT}}$ signal. Furthermore, the REFCLK and OSCOUT/N signals must both be logic zero so that the output of NOR gate 118 is logic one by the time of the positive-going transition of the $\overline{\text{TIMESLOT}}$ signal to indicate a phase locked condition for PLL 10.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A lock detection circuit, comprising:
  a NAND gate having first and second inputs and an output, said first input receiving a first digital input signal, said second input receiving a second digital input signal;

a first transistor having a gate, a drain and a source, said drain being coupled to said output of said NAND gate, said gate receiving a control signal;

a first latching circuit having an input coupled to said source of said first transistor and having an output; and a NOR gate having first, second and third inputs and an output, said first input receiving said first digital input signal, said second input receiving said second digital input signal, said third input being coupled to said output of said first latching circuit, said output providing a lock detection signal.

2. The lock detection circuit of claim 1 further including:

a second transistor having a gate, a drain and a source, said drain being coupled to said output of said NOR gate;

a first inverter having an input receiving said control signal and having an output coupled to said gate of said second transistor;

a second latching circuit having an input coupled to said source of said second transistor and having an output for passing said lock detection signal.

3. The lock detection circuit of claim 2 further including:

a second inverter having an input coupled to said output of said second latching circuit and having an output;

a third transistor having a gate, a drain and a source, said drain being coupled to said output of said second inverter, said gate receiving said control signal; and a third inverter having an input coupled to said source of said third transistor and having an output for passing said lock detection signal.

4. The lock detection circuit of claim 3 wherein said first latching circuit includes:

a fourth inverter having an input coupled to said source of said first transistor and having an output;

a fifth inverter having an input coupled to said output of said fourth inverter and having an output coupled to said third input of said NOR gate; and a fourth transistor having a gate, a drain and a fifth inverter, said source being coupled to said input of said fourth inverter, said gate receiving a positive power supply potential.

5. The lock detection circuit of claim 4 wherein said second latching circuit includes:

a sixth inverter having an input coupled to said source of said second transistor and having an output;

a seventh inverter having an input coupled to said output of said sixth inverter and having an output coupled to said input of said second inverter; and a fourth transistor having a gate, a drain and a source, said drain being coupled to said output of said seventh inverter, said source being coupled to said input of said sixth inverter, said gate receiving said positive power supply potential.

6. A phase lock loop, comprising:

first means for comparing a phase of first and second digital input signals and generating an output signal to charge and discharge a loop node to a loop node voltage;

a voltage controlled oscillator having an input coupled for receiving said output signal of said first means and providing an oscillator signal operating at a frequency as determined by said loop node voltage;

second means having an input coupled for receiving said oscillator signal from said voltage controlled oscillator and dividing down the frequency thereof for providing said second digital input signal to said first means, said second means having a second output for providing a control signal with first and second transitions; and a lock detection circuit having first, second and third inputs and an output, said first input being coupled for receiving said first digital input signal, said second input being coupled for receiving said second digital input signal, said third input receiving said control signal, said output providing a lock detection signal when said first and second digital input signals have a first logic state at said first transition of said control signal and a second logic state at said second transition of said control signal.

7. The phase lock loop of claim 6 further including filter means coupled to said loop node for low-pass filtering said loop node voltage.

8. The phase lock loop of claim 7 wherein said lock detection circuit includes:

a NAND gate having first and second inputs and an output, said first input receiving said first digital input signal, said second input receiving said second digital input signal;

a first transistor having a gate, a drain and a source, said drain being coupled to said output of said NAND gate, said gate receiving said control signal;

a first latching circuit having an input coupled to said source of said first transistor and having an output; and a NOR gate having first, second and third inputs and an output, said first input receiving said first digital input signal, said second input receiving said second digital input signal, said third input being coupled to said output of said first latching circuit, said output providing said lock detection signal.

9. The phase lock loop of claim 8 wherein said lock detection circuit further includes:

a second transistor having a gate, a drain and a source, said drain being coupled to said output of said NOR gate;

a first inverter having an input receiving said control signal and having an output coupled to said gate of said second transistor; and a second latching circuit having an input coupled to said source of said second transistor and having an output for passing said lock detection signal.

10. The phase lock loop of claim 9 wherein said lock detection circuit further includes:

a second inverter having an input coupled to said output of said second latching circuit and having an output;

a third transistor having a gate, a drain and a source, said drain being coupled to said output of said second inverter, said gate receiving said control signal; and a third inverter having an input coupled to said source of said third transistor and having an output for passing said lock detection signal.

11. The phase lock loop of claim 10 wherein said first latching circuit includes:

a fourth inverter having an input coupled to said source of said first transistor and having an output;

a fifth inverter having an input coupled to said output of said fourth inverter and having an output coupled to said third input of said NOR gate; and a fourth transistor having a gate, a drain and a source, said drain being coupled to said output of said fifth inverter, said source being coupled to said input of said fourth inverter, said gate receiving a positive power supply potential.

12. The phase lock loop of claim 11 wherein said second latching circuit includes:

a sixth inverter having an input coupled to said source of said second transistor and having an output;

a seventh inverter having an input coupled to said output of said sixth inverter and having an output coupled to said input of said second inverter; and a fourth transistor having a gate, a drain and a source, said drain being coupled to said output of said seventh inverter, said source being coupled to said input of said sixth inverter, said gate receiving said positive power supply potential.

13. The phase lock loop of claim 12 wherein said second means includes a third output for providing a sample clock active prior to said first transition of said control signal.

14. The phase lock loop of claim 13 further comprising:

a shift register having a data input, a clock input and a plurality of outputs, said data input being coupled for receiving said lock detection signal from said lock detection circuit, said clock input being coupled for receiving said sample clock signal from said third output of said second means; and an AND gate having a plurality of inputs coupled to said plurality of outputs of said shift register and having an output for providing a lock indicator signal.

15. A method of detecting phase lock for a phase lock loop responsive to a first digital signal for generating a second digital signal operating substantially at frequency and in-phase with said first digital signal, comprising the steps of:

comparing a phase difference between said first and second digital input signals and generating an output signal to charge and discharge a loop node;

generating an oscillator signal operating at a frequency as determined by said output signal;

dividing down a frequency of said oscillator signal for providing said second digital input signal and a control signal having first and second transitions; and sampling said first and second digital input signals at said first and second transitions of said control signal and providing a lock detection signal when said first and second digital input signals have a first logic state at said first transition of said control signal and a second logic state at said second transition of said control signal.

* * * * *

UNITED STATES PATENT AND TRADEMARK OFFICE
CERTIFICATE OF CORRECTION

PATENT NO. : 5,278,520
DATED      : January 11, 1994
INVENTOR(S): Lanny L. Parker,
             Ahmad H. Atriss It is certified that error appears in the above-indentified patent and that said Letters Patent is hereby corrected as shown below:

In column 7, claim 4, line 43, please delete the words "fifth inverter, said source being coupled to said input of said input of said fourth inverter" and insert therefor --source, said drain being coupled to said output of said fifth inverter, said source being coupled to said input of said fourth inverter--.

Signed and Sealed this

Nineteenth Day of July, 1994

Attest:

BRUCE LEHMAN

*Attesting Officer*     *Commissioner of Patents and Trademarks*